United States Patent
Xu et al.

(10) Patent No.: US 10,465,277 B2
(45) Date of Patent: Nov. 5, 2019

(54) MASK AND EVAPORATION DEVICE

(71) Applicants: BOE Technology Group Co., Ltd., Beijing (CN); Hefei Xinsheng Optoelectronics Technology Co., Ltd., Hefei (CN)

(72) Inventors: Peng Xu, Beijing (CN); Yongkang Qiao, Beijing (CN); Shengkai Pan, Beijing (CN); Jie Liu, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/561,716

(22) PCT Filed: Mar. 1, 2017

(86) PCT No.: PCT/CN2017/075341
§ 371 (c)(1),
(2) Date: Sep. 26, 2017

(87) PCT Pub. No.: WO2018/028183
PCT Pub. Date: Feb. 15, 2018

(65) Prior Publication Data
US 2018/0245198 A1  Aug. 30, 2018

(30) Foreign Application Priority Data
Aug. 8, 2016  (CN) .................... 2016 2 0851904 U

(51) Int. Cl.
C23C 16/00 (2006.01)
C23C 14/04 (2006.01)
C23C 14/24 (2006.01)

(52) U.S. Cl.
CPC ............ *C23C 14/042* (2013.01); *C23C 14/24* (2013.01)

(58) Field of Classification Search
CPC .............................. C23C 14/04; C23C 14/042
See application file for complete search history.

(56) References Cited

U.S. PATENT DOCUMENTS 3,323,490 A * 6/1967 McGilliard ........... C23C 14/042
118/504
6,480,260 B1 * 11/2002 Donders ................. G03F 7/707
250/492.2

(Continued)

FOREIGN PATENT DOCUMENTS

| CN | 103668051 A | 3/2014 |
| CN | 103668053 A | 3/2014 |
| CN | 205856592 U | 1/2017 |

OTHER PUBLICATIONS

Jun. 6, 2017—International Search Report and Written Opinion Appn PCT/CN2017/075341 with Eng Tran.

*Primary Examiner* — Keath T Chen
(74) *Attorney, Agent, or Firm* — Banner & Witcoff, Ltd.

(57) ABSTRACT

The mask includes a frame and a first mask strip disposed inside the frame; the frame includes an outer frame and an inner frame; the outer frame is disposed on the outer side and includes a first plane; the inner frame is disposed on the inner side and includes a second plane; the first plane is higher than the second plane, so as to form a step; the first mask strip is fixed on the outer frame through two ends and extended in the outer frame along one side of the frame; and an orthographic projection of the first mask strip on the second plane is at least partially overlapped with the inner frame on the one side.

13 Claims, 5 Drawing Sheets

(56) References Cited

U.S. PATENT DOCUMENTS

| | | | |
|---|---|---|---|
| 2006/0011137 A1* | 1/2006 | Keller | C23C 16/042 118/720 |
| 2007/0184195 A1* | 8/2007 | Hatakeyama | C23C 14/042 427/282 |
| 2008/0018236 A1* | 1/2008 | Arai | C23C 14/042 313/504 |
| 2010/0224125 A1* | 9/2010 | Lee | C23C 14/042 118/504 |
| 2012/0107506 A1 | 5/2012 | Ukigaya et al. | |
| 2016/0301006 A1* | 10/2016 | Obata | H01L 51/0011 |

* cited by examiner

MASK AND EVAPORATION DEVICE

The application is a U.S. National Phase Entry of International Application No. PCT/CN2017/075341 filed on Mar. 1, 2017, designating the United States of America and claiming priority to Chinese Patent Application No. 201620851904.X, filed Aug. 8, 2016. The present application claims priority to and the benefit of the above-identified applications and the above-identified applications are incorporated by reference herein in their entirety.

TECHNICAL FIELD

Embodiments of the present disclosure relate to a mask and an evaporation device.

BACKGROUND

Evaporation process is widely applied in the coating process for electronic devices. The principle of the evaporation process is to place a substrate for evaporation in a vacuum environment and deposit an evaporation material(s) on a surface of the substrate for evaporation for forming of film. Film formation areas of the substrate for evaporation are usually defined by mask strips.

In the evaporation process, if the edge of the substrate is scratched, the problems such as breakage of a peripheral circuit and package failure can be easily caused, so the yield and the service life of products can be disadvantageously affected. The scratching of the edge of the substrate is usually caused by the relative motion between the mask strips and the glass substrate during contact.

Currently, in order to solve the problem that the substrate can be easily scratched, on one hand, the sharpness and the roughness of edges of the mask strips are effectively controlled; and on the other hand, the relative motion between the mask strips and the glass substrate is slowed down, and the mutual acting force of the mask strips and the glass substrate is weakened. However, in order to ensure the flatness requirement in the contact of the mask strips and the glass substrate, the thickness of the mask strips is generally 100 μm or less, so the edges of the mask strips will be inevitably sharp. The mask strips are manufactured by an etching process, and it is greatly difficult to control the sharpness and the roughness of the edges of the mask strips by adjusting the parameters of the etching process.

SUMMARY

At least embodiment of the present disclosure provides a mask, including a frame and a first mask strip disposed inside the frame; the frame includes an outer frame and an inner frame; the outer frame is disposed on an outer side and includes a first plane; the inner frame is disposed on an inner side and includes a second plane; the first plane is higher than the second plane so as to form a step; the first mask strip is fixed on the outer frame through two ends and extended inside the outer frame along one side of the frame; and an orthographic projection of the first mask strip on the second plane is at least partially overlapped with the inner frame on the one side.

For example, in the mask in an embodiment of the present disclosure, a height difference between the first plane and the second plane is 1 mm-10 mm.

For example, in the mask in an embodiment of the present disclosure, the height difference between the first plane and the second plane is 5 mm.

For example, in the mask in an embodiment of the present disclosure, on the first plane and in a direction perpendicular to an extension direction of the first mask strip, the distance between a main body of the first mask strip and the outer frame is 0.5 mm-2 mm.

For example, the mask in an embodiment of the present disclosure further comprises a second mask strip disposed inside the frame.

For example, in the mask in an embodiment of the present disclosure, the second mask strip is fixed on the outer frame through two ends and extended inside the outer frame along an other side of the frame; and an orthographic projection of the second mask strip on the second plane is at least partially overlapped with the inner frame on the other side.

For example, in the mask in an embodiment of the present disclosure, there is an overlapped area between the second mask strip and the first mask strip.

For example, in the mask in an embodiment of the present disclosure, the second mask strip is fixed on the outer frame through two ends; and the second mask strip is intersected with a middle part of the first mask strip so as to divide an area encircled by the frame into a plurality of sub-areas.

For example, in the mask in an embodiment of the present disclosure, the first mask strip and the second mask strip have an equal thickness.

For example, in the mask in an embodiment of the present disclosure, both the thicknesses of the first mask strip and the thickness of the second mask strip are 50 μm-100 μm.

At least embodiment of the present disclosure provides an evaporation device comprising any mask that is described above.

For example, in an embodiment of the present disclosure, the evaporation device further comprises a magnet arranged opposite to the mask, the first mask strip has a magnetic property and is capable of being attracted by the magnet to move.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
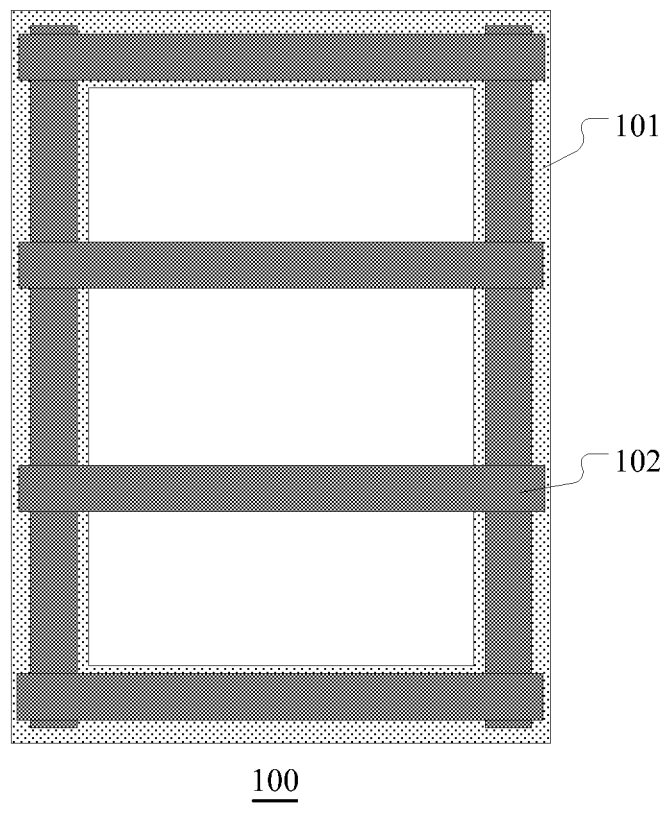
FIG. 1 is a schematic structural plan view of a mask.

FIG. 1 is a schematic structural plan view of a mask. As illustrated in FIG. 1, the mask 100 comprises a frame 101 and mask strips 102 fixed on the frame 101. As can be seen from FIG. 1, the mask 100 comprises six mask strips 102, four mask strips of which are fixed at the periphery of the frame 101 and make direct contact with the frame; orthographic projections of the four mask strips on a plane in which the frame is provided are overlapped with the frame; and the rest two mask strips are lapped over the frame 101. The inventors have noted in research that: the four mask strips fixed at the periphery of the frame 101 are key reasons in causing the scratching of the substrate; and as the main bodies of the peripheral mask strips make direct contact with the frame 101, when the peripheral mask strips are attracted by the magnetic force of magnets, the tilting motion of the mask strips is limited, so the probability that the mask strips move upwards and scratch the glass substrate is increased, namely the degree of freedom of the mask strips is limited, so the mutual acting force between the mask strips and the glass substrate is increased, and hence the glass substrate can be scratched. From the aspect of increasing the degree of freedom of the mask strips, the problem of the scratching of the edge of the substrate can be solved by slowing down the relative motion between the mask strips and the glass substrate. For instance, if the peripheral four mask strips are also manufactured to be lapped over the frame as the other two mask strips, the problem that the glass substrate is scratched by the mask strips can be obviously reduced. However, in this case, this configuration brings about the film leakage phenomenon during evaporation, so the product yield can be reduced. In order to solve the above problem, in the present disclosure, the structure of the frame is modified and designed have two planes with different heights so as to form a step(s); and first mask strips are lapped over an outer frame of the frame, so the main bodies of the first mask strips will not make contact with the frame. Thus, the present disclosure avoids the problem that the glass substrate is scratched by the first mask strips, and effectively improves the yield and the service life of subsequent products.

At least one embodiment of the present disclosure provides a mask, which comprises a frame and a first mask strip disposed inside the frame. The frame includes an outer frame that is disposed on the outer side and includes a first plane and an inner frame that is disposed on the inner side and includes a second plane; the first plane is higher than the second plane so as to form a step; the first mask strip is fixed on the outer frame through two ends and is extended inside the outer frame along one side of the frame; and an orthographic projection of the first mask strip on the second plane is at least partially overlapped with the inner frame on one side.

Figure 2:
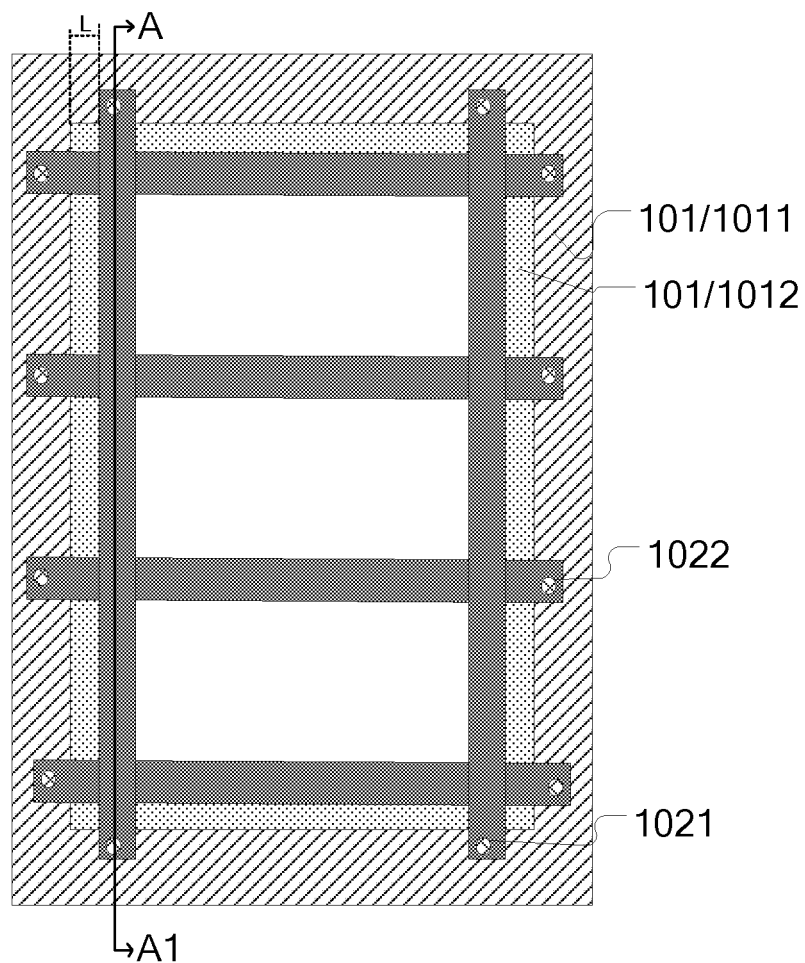
FIG. 2 is a schematic structural plan view of a mask provided by an embodiment of the present disclosure.
Figure 2A:
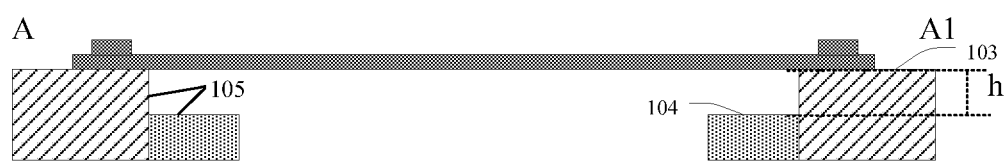
FIGS. 2a-2b are schematic structural sectional views of the mask as illustrated in FIG. 2.
Figure 2B:

An embodiment of the present disclosure provides a mask. FIG. 2 is a schematic structural plan view of the mask provided by the embodiment of the present disclosure. FIGS. 2a and 2b are schematic structural sectional views of the mask as illustrated in FIG. 2.

As shown in FIGS. 2, 2a and 2b, the mask 100 comprises a frame 101 and first mask strips 1021 disposed inside the frame 101. The frame 101 includes an outer frame 1011 and an inner frame 1012; the outer frame 1011 is disposed on the outer side and includes a first plane 103; the inner frame 1012 is disposed on the inner side and includes a second plane 104; the first plane 103 is higher than the second plane 104, relative to a bottom surface of the frame 101, so as to form a step 105; each first mask strip 1021 is fixed on the outer frame 1011 through two ends and is extended inside the outer frame 1011 along one side of the frame 101; and an orthographic projection of the first mask strip 1021 on the second plane 104 is partially overlapped with the inner frame 1012 on sides. In FIG. 2, two first mask strips 1021 are arranged in the longitudinal direction and respectively disposed on the left side and the right side of the frame 101; and the first mask strips 1021 are respectively fixed on the outer frame 1011 through two end portions and respectively fixed inside the outer frame on the left side and the right side of the frame 101 (namely the main body except the end portions is disposed inside the outer frame), so the orthographic projection of the first mask strip 1021 on the second plane 104 is not overlapped with the outer frame 1011. The fixing means of the end portions of the first mask strip 1021 may include welding, riveting, etc.

For instance, the inner frame 1012 and the outer frame 1011 are integrally formed; after a frame body is formed, the side of the outer frame closer to the area defined by the frame is etched to a certain thickness, so as to form the step 105 formed by the first plane 103 and the second plane 104, and the first plane 103 is higher than the second plane 104. Or the frame 101 may be formed in one piece by stamping. Or the inner frame 1012 and the outer frame 1011 are respectively formed and then connected with each other (e.g., by welding) to form a whole body including the first plane 103 and the second plane 104, and the first plane 103 is higher than the second plane 104, so as to form the step 105.

For instance, as for the cases where the overlapped area between the orthographic projection of the first mask strip 1021 on the second plane 104 and the inner frame 1012 on one side has different sizes, the sectional view along A-A1 in FIG. 2 is also different. It should be noted that the section line A-A1 is a center line of the first mask strip 1021. For instance, as illustrated in FIG. 2a, when the overlapped area between the first mask strip 1021 and the inner frame 1012 is small and does not exceed beyond the center line of the first mask strip, there are partially overlapped areas between orthographic projections of the two end portions of the first mask 1021 and the inner frame 1012 on one side, namely the orthographic projections of the end portions of the first mask strip 1021 on the second plane 104 are overlapped with the inner frame 1012 on one side. As illustrated in FIG. 2*b*, when the overlapped area between the first mask strip 1021 and the inner frame 1012 is large and exceeds beyond the center line of the first mask strip, there are overlapped areas between orthographic projections of the main body and the two end portions of the first mask strip 1021 on the second plane 104 and the inner frame 1012 on one side. As can be seen from FIGS. 2*a* and 2*b*, the first mask strip 1021 is lapped over the outer frame 1011 and mounted above the inner frame 1012 and the step 105; and in the direction perpendicular to the extension direction of the first mask strip 1021, one part of an orthographic projection of the first mask strip 1021 on the second plane 104 is overlapped with the inner frame 1012 on one side, and the other part falls within an area defined by the inner frame 1012.

For instance, as illustrated in FIG. 2*a* or 2*b*, the height difference h between the first plane 103 and the second plane 104 is 1 mm-10 mm. Illustratively, the height difference h between the first plane 103 and the second plane 104 is 5 mm. Within the height difference range, when the first mask strip 1021 moves under the action of an external acting force, the main body of the first mask strip does not make contact with the inner frame, so the degree of freedom of the first mask strip is not limited.

For instance, as illustrated in FIG. 2, on the first plane 103 and in the direction perpendicular to the extension direction of the first mask strip 1021, the distance L between the main body of the first mask strip 1021 and the outer frame 1011 is 0.5 mm-2 mm. Illustratively, L is 1 mm. Within the range of L, when the first mask strip 1021 makes contact with the outer frame 1011 under the action of the external acting force, the problem of increasing the scratch degree of the glass substrate will not occur.

For instance, the first mask strip 1021 is fixed on the outer frame by means of welding. The welding includes spot welding, etc.

For instance, as illustrated in FIG. 2, the mask 100 may further comprise second mask strips 1022 disposed on the inner side of the frame 101. The second mask strips 1022 are fixed on the outer frame 1011 and extended inside the frame 1011 along the other side of the frame 101. As similar to the first mask strips 1021 as described above, an orthographic projection of each second mask strip 1022 on the second plane 104 is at least partially overlapped with the inner frame 1012 on the other side. For instance, the partial overlap here includes the overlap of orthographic projections of end portions of the second mask strip 1022 on the second plane 104 and the inner frame 1012 on the other side, and the overlap of an orthographic projection of a main body of the second mask strip 1022 on the second plane 104 and the inner frame 1012 on the other side.

In FIG. 2, two second mask strips are transversely arranged on the upper side and the lower side of the frame 101 respectively. The second mask strips 1022 are respectively fixed on the outer frame 1011 through two end portions, and respectively disposed inside the outer frame on the upper side and the lower side of the frame 101 (namely a main body except the end portions is disposed inside the outer frame), so there is no overlapped area between the orthographic projection of the second mask strip 1022 on the second plane 104 and the outer frame 1011. The fixing means of the end portions of the second mask strip 1022 may include welding, riveting, etc.

For instance, as illustrated in FIG. 2, other transversely extended second mask strips 1022 are also included and disposed in the middle of the frame 101. These second mask strips 1022 are fixed on the outer frame 1011 through two end portions and intersected with the middle of the first mask strips 1021, so as to divide the area encircled by the frame into a plurality of sub-areas. According to actual demands, the size of the sub-areas formed here may be same or different. For instance, a plurality of first mask strips 1021 may also be fixed on the outer frame so as to divide an area encircled by the frame 101 into more sub-areas.

For instance, as illustrated in FIG. 2, there are overlapped areas between the second mask strips 1022 and the first mask strips 1021. The thickness at the overlapped area is the sum of the thickness of the second mask strip 1022 and the first mask strip 1021, namely the second mask strip 1022 and the first mask strip 1021 make contact with each other.

Figure 3:
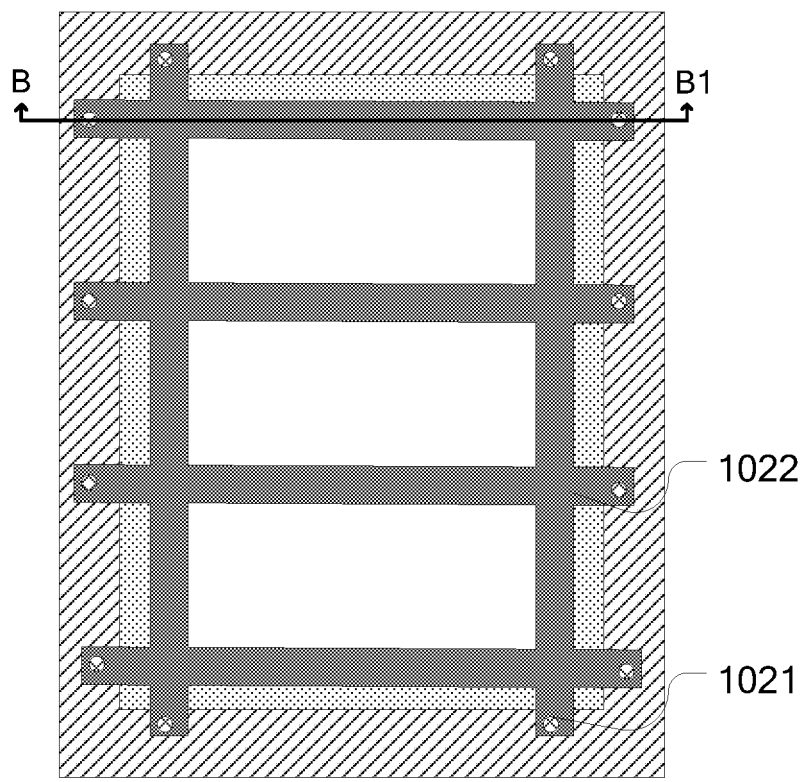
FIG. 3 is a schematic structural plan view of a mask provided by an embodiment of the present disclosure.
Figure 3A:
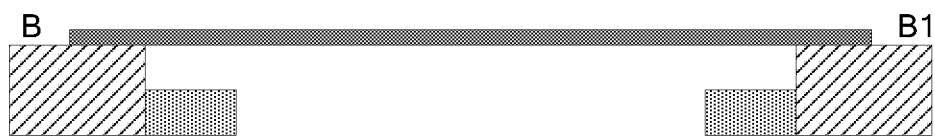
FIG. 3a is a schematic structural sectional view of the mask as illustrated in FIG. 3.

For instance, as illustrated in FIGS. 3 and 3*a*, the first mask strip 1021 and the second mask strip 1022 have an equal thickness, and are respectively etched by a half of the thickness at the intersected area. The thickness at the intersected area is the thickness of one mask strip. Thus, when the first mask strips 1021 and the second mask strips 1022 are closely attached to a substrate for evaporation, the problem of uneven evaporated film on the substrate due to unevenness at the intersected areas does not occur.

For instance, both the thicknesses of the first mask strip 1021 and the thickness of the second mask strip 1022 are 50 µm-100 µm, e.g., 50 µm, 75 µm or 100 µm.

It should be noted that the numbers of the first mask strips 1021 and the second mask strips 1022 as illustrated in FIGS. 2 and 3 are only illustrative and obviously not limited to the case as illustrated in FIG. 2. A plurality of mask strips 1021 or a plurality of second mask strips 1022 may also be disposed in the area defined by the frame as required so as to form required film forming areas. For instance, other first mask strip(s) 1021 may also be disposed at the middle part of the frame in the transverse direction.

Figure 4:
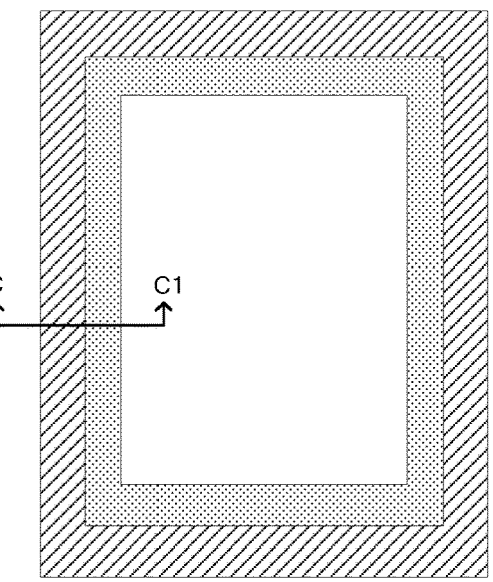
FIG. 4 is a schematic structural plan view of a frame in an embodiment of the present disclosure.
Figure 4A:
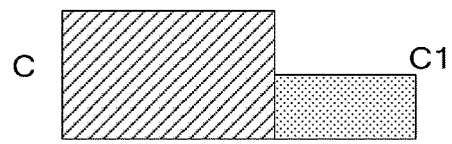
FIGS. 4a-4d are schematic structural sectional views of the frame as illustrated in FIG. 4.
Figure 4B:
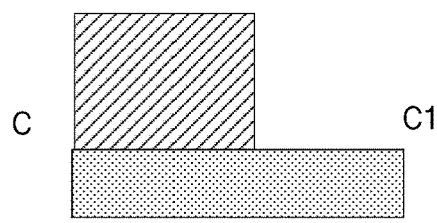
Figure 4C:
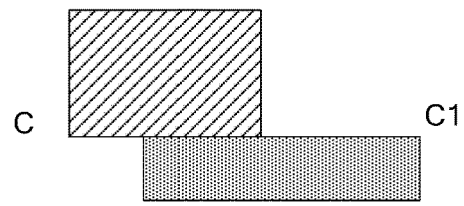
Figure 4D:
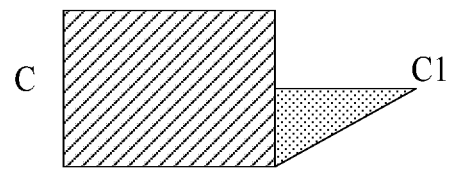

FIG. 4 is a schematic structural plan view of the frame in the embodiment of the present disclosure. FIGS. 4*a*-4*d* are schematic structural sectional views of the frame as illustrated in FIG. 4. As illustrated in FIG. 4*a*, an orthographic projection of the inner frame on the first plane is in butt joint with one side of the outer frame; or as illustrated in FIGS. 4*b* and 4*c*, the orthographic projection of the inner frame on the first frame is at least partially overlapped with one side of the outer frame; or as illustrated in FIG. 4*d*, one surface of the inner frame, opposite to the second plane, is set to be in the shape of an inclined slope, so as to provide convenience for the uniform coating of an evaporation material(s) at edge areas during evaporation.

An embodiment of the present disclosure further provides an evaporation device, which comprises the mask provided by the first embodiment.

Figure 5A:
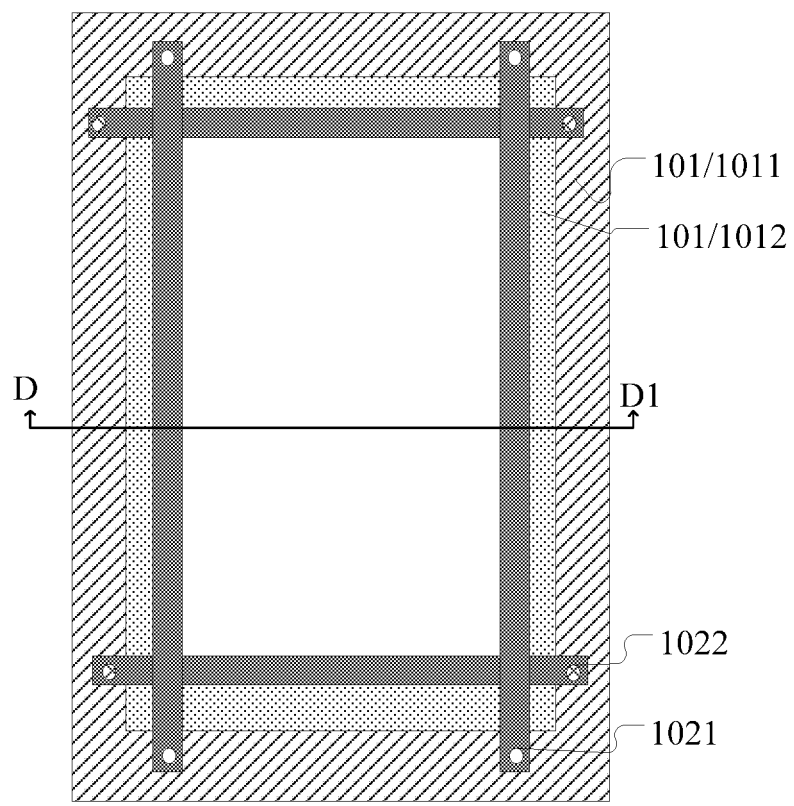
FIG. 5a is a schematic structural plan view of a mask.
Figure 5B:
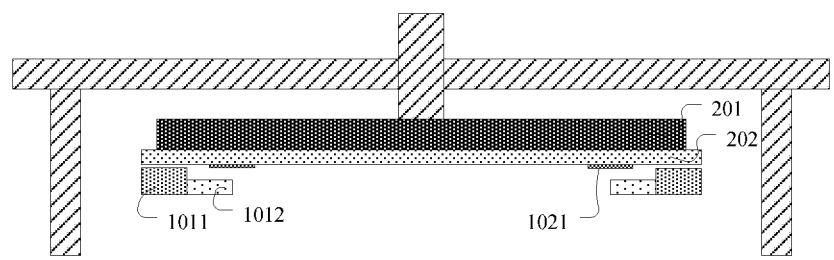
FIG. 5b is a schematic structural sectional view when the mask as illustrated in FIG. 5a is applied to an evaporation device.

For instance, FIG. 5*a* is a schematic structural plan view of the mask, and FIG. 5*b* is a schematic structural sectional view when the mask as illustrated in FIG. 5 is applied to the evaporation device. For instance, the section of the mask in FIG. 5*b* is cut along D-D1 line in FIG. 5*a*.

For instance, as illustrated in FIG. 5*b*, the evaporation device further comprises a magnet 201 arranged opposite to the mask. At this point, the magnet and the mask 100 are respectively disposed on both sides of a glass substrate 202 to be evaporated. In this case, the first mask strips 1021 are made from magnetic materials, e.g., iron (Fe), nickel (Ni) or Fe—Ni alloy materials. The first mask strips are closely attached to the glass substrate for evaporation under the action of the magnetic force of the magnet 201 on the first mask strips.

For instance, the second mask strips also have magnetic property; the second mask strip is fixed on the outer frame through two ends; a plurality of second mask strips may also be arranged; the second mask strips may be intersected with the middle parts of the first mask strips so as to divide the area encircled by the frame into a plurality of sub-areas; and the first mask strips and the second mask strips are closely attached to the glass substrate for evaporation under the action of the magnetic force of the magnet on the first mask strips and the second mask strips, so as to form a plurality of film forming areas.

The mask and the evaporation device, provided by an embodiment of the present disclosure, have the following advantages: the structure of the frame is modified and designed into having two planes with different heights, so as to form a step; subsequently, the first mask strips are lapped over the frame; and two ends of each first mask strip are fixed on the outer frame, but the main body does not make contact with the frame so as to avoid the problem that the glass substrate is scratched by the first mask strips and effectively improve the yield and the service life of subsequent products.

The following points should be noted:

(1) The accompanying drawings in the embodiments of the present disclosure only involve structures relevant to the embodiments of the present disclosure, and other structures may refer to the art of state.

(2) For clarity, in the accompanying drawings of the embodiments of the present disclosure, the thickness of layers or regions is enlarged or reduced, namely the accompanying drawings are not drawn according to actual scales. It should be understood that: when an element such as a layer, a film, a region or a substrate is referred to as being disposed "on" or "beneath" another element, the element may be "directly" disposed "on" or "beneath" another element, or an intermediate element may be provided.

(3) The embodiments of the present disclosure and the characteristics in the embodiments may be mutually combined to obtain new embodiments without conflict.

The foregoing is only the preferred embodiments of the present disclosure and not intended to limit the scope of protection of the present disclosure. The scope of protection of the present disclosure should be defined by the appended claims.

The application claims priority to the Chinese patent application No. 201620851904.X, filed Aug. 8, 2016, the disclosure of which is incorporated herein by reference as part of the application.

What is claimed is:

1. A mask, comprising a frame and a first mask strip and a second mask strip which are disposed inside the frame, wherein
   the frame includes a bottom surface, and includes an outer frame and an inner frame which is within an enclosed region defined by the outer frame, and the outer frame and the inner frame are both in a rectangular shape defining a length direction and a width direction perpendicular to the length direction; the outer frame includes a first surface in a first plane which is opposite to the bottom surface; the inner frame includes a second surface in a second plane which is parallel to the bottom surface and opposite to the bottom surface; the first plane is higher than the second plane so as to form a step relative to the bottom surface in a third direction perpendicular to the bottom surface;
   the first mask strip and the second mask strip each comprises two ends and a main body between the two ends, the first mask strip is fixed to the outer frame through the two ends of the first mask strip, and the main body of the first mask strip is extended along the length direction; and the second mask strip is fixed to the outer frame through the two ends of the second mask strip, and the main body of the second mask strip is extended along the width direction;
   a first gap is formed between the main body of the first mask strip and an inner edge in the length direction of the outer frame, and at least a first portion of the second surface of the inner frame is exposed through the first gap;
   a second gap is formed between the main body of the second mask strip and an inner edge in the width direction of the outer frame, and at least a second portion of the second surface of the inner frame is exposed through the second gap;
   the first mask strip is spaced apart from the second surface of the inner frame in the third direction, and an orthographic projection of the first mask strip onto the second plane in the third direction partially overlaps with the second surface of the inner frame; and
   the second mask strip is spaced apart from the second surface of the inner frame in the third direction, and an orthographic projection of the second mask strip onto the second plane in the third direction partially overlaps with the second surface of the inner frame.

2. The mask according to claim 1, wherein a height difference between the first plane and the second plane is 1 mm 10 mm.

3. The mask according to claim 2, wherein the height difference between the first plane and the second plane is 5 mm.

4. The mask according to claim 1, wherein the inner edge in the length direction of the outer frame and the first mask strip are parallel such that the first gap has a uniform width of 0.5 mm-2 mm.

5. The mask according to claim 1, wherein there is an overlapped area between the second mask strip and the first mask strip.

6. The mask according to claim 5, wherein the second mask strip is intersected with a middle part of the first mask strip so as to divide the enclosed region defined by the outer frame into a plurality of sub-areas.

7. The mask according to claim 6, wherein the first mask strip and the second mask strip have an equal thickness.

8. The mask according to claim 6, wherein both a thickness of the first mask strip and a thickness of the second mask strip are 50 μm-100 μm.

9. The mask according to claim 5, wherein the first mask strip and the second mask strip have an equal thickness.

10. The mask according to claim 5, wherein both a thickness of the first mask strip and a thickness of the second mask strip are 50 μm-100 μm.

11. The mask according to claim 1, wherein both a thickness of the first mask strip and a thickness of the second mask strip are 50 μm-100 μm.

12. An evaporation device, comprising the mask according to claim 1.

13. The evaporation device according to claim 12, further comprising a magnet arranged opposite to the mask, wherein the first mask strip has a magnetic property and is capable of being attracted by the magnet to move.

* * * * *